US005527720A

United States Patent [19]

Goodyear et al.

[11] Patent Number: 5,527,720

[45] Date of Patent: Jun. 18, 1996

[54] METHOD OF FORMING A SEMICONDUCTOR DEVICE HAVING A VERTICAL INSULATED GATE FET AND A BREAKDOWN REGION REMOTE FROM THE GATE

[75] Inventors: Andrew L. Goodyear, Redhill; Keith M. Hutchings, Groombridge, both of England

[73] Assignee: U.S. Philips Corporation, New York, N.Y.

[21] Appl. No.: 471,298

[22] Filed: Jun. 6, 1995

Related U.S. Application Data

[62] Division of Ser. No. 429,438, Apr. 27, 1995, which is a continuation of Ser. No. 102,038, Aug. 4, 1993, abandoned.

[30] Foreign Application Priority Data

Aug. 5, 1992 [GB] United Kingdom .................. 9216599

[51] Int. Cl.$^6$ .............................................. H01L 21/8232

[52] U.S. Cl. .............................................. 437/29

[58] Field of Search ............................ 437/29, 913, 203, 437/40 DM, 41 DM; 148/DIG. 126

[56] References Cited

U.S. PATENT DOCUMENTS

| | | | |
|---|---|---|---|
| 4,573,066 | 2/1986 | Whight | 257/495 |
| 4,707,719 | 11/1987 | Whight | 257/489 |
| 4,774,560 | 9/1988 | Coe | 257/495 |
| 4,914,058 | 4/1990 | Blanchard | 148/DIG. 126 |
| 4,931,846 | 6/1990 | Mihara | 257/339 |
| 4,983,535 | 1/1991 | Blanchard | 437/29 |
| 5,072,266 | 12/1991 | Bulucea et al. | 437/38 |
| 5,160,491 | 11/1992 | Mori | 437/29 |
| 5,387,528 | 2/1995 | Hutchings et al. | 148/DIG. 26 |
| 5,405,794 | 4/1995 | Kim | 437/41 DM |

*Primary Examiner*—Tom Thomas
*Assistant Examiner*—Michael Trinh
*Attorney, Agent, or Firm*—Steven R. Biren

[57] ABSTRACT

A semiconductor device (1) includes a vertical insulated gate field effect device (2) and has a semiconductor body (3) with a first semiconductor region (4) of one conductivity type adjacent one major surface (5). A second semiconductor region (6) of the opposite conductivity type is formed within the first region (4) adjacent the surface (5) and a third region (7) forms with the second region (6) a rectifying junction (8) meeting the one major surface (5). A recess (9) extends into the first region (4) from the one major surface (5) so that the second and third regions (6 and 7) abut the recess (9), and an insulated gate (10) is formed within the recess (9) for controlling conduction between the first and third regions (4 and 7) along a conduction channel area (61) of the second region (6). A fourth region (11) of the one conductivity type forms with a portion (**6*b*) of the second region (6) of the opposite conductivity type remote from the recess (9) a further rectifying junction (12) which is reverse-biassed in at least one mode of operation of the device and has a predetermined breakdown voltage for causing the device to breakdown in the vicinity of the further rectifying junction (12) away from the recess (9**) when a critical voltage is exceeded.

1 Claim, 3 Drawing Sheets

METHOD OF FORMING A SEMICONDUCTOR DEVICE HAVING A VERTICAL INSULATED GATE FET AND A BREAKDOWN REGION REMOTE FROM THE GATE

This is a division of application Ser. No. 08/429,438, filed on Apr. 27, 1995, pending, which is a continuation of Ser. No. 08/102,038, filed Aug. 4, 1993, abandoned.

This invention relates to a semiconductor device comprising a vertical insulated gate field effect device, in particular an insulated gate field effect device in which the insulated gate is formed within a recess extending into a semiconductor body, and to a method of manufacturing such a device.

As used herein the term "vertical insulated gate field effect device" means an insulated gate field effect device in which the main current path is between two opposed major surfaces of the semiconductor body.

U.S. Pat. No. 5,072,266 describes a vertical insulated gate field effect device of this type. In particular, U.S. Pat. No. 5,072,266 describes a power MOSFET which consists of many parallel-connected insulated gate field effect device cells formed within a first region adjacent one major surface of the semiconductor body with the first region providing a conductive path to a main electrode formed on the other major surface of the semiconductor body. Each device cell consists of a second semiconductor region of the opposite conductivity type formed within the first region adjacent the one major surface, a third semiconductor region forming with the second region a pn junction meeting the one major surface and a recess extending through the second and third regions into the first region. The recesses of the device cells are connected together to define a continuous trench within which a continuous insulated gate structure is provided for controlling conduction along conduction channel regions of the second regions bounding the trench.

The use of such a structure to form an insulated gate field effect device such as a power MOSFET enables, for a given conduction channel length, higher device cell packing densities to be achieved than can be attained using a planar structure, that is a structure in which the insulated gate is formed on the one major surface. However, in such a structure the point at which breakdown will occur will generally be adjacent the trench because of the high electric fields which can arise at sharp edges or corners of the trench. This can cause problems such as hot charge carrier injection into the gate insulating layer which could result in degradation of the device performance and may exacerbate the possibility of destructive bipolar breakdown, especially when switching an inductive load. U.S. Pat. No. 5,072,266 aims to overcome or at least reduce these problems by providing each second region with a more highly doped highly curved subsidiary region which is located away from the conduction channel regions centrally of the device cell bounded by the trench and which extends into the first region further than the trench so that when a critical voltage is exceeded breakdown of the device occurs in the bulk of the semiconductor body in the vicinity of the reverse-biassed pn junction between the central highly doped subsidiary region of the second region and the first region.

Thus the point of initation of avalanche breakdown is moved away from the trench reducing the possibility of hot charge carrier injection into the gate insulating layer. Moving the point of initiation of avalanching into the bulk of the semiconductor device should be of advantage where the device is to be used for switching an inductive load because higher currents can be carried within the bulk of the semiconductor body thus enabling faster dissipation of the excessive energy resulting from the rapid rise in voltage across the device which may occur during the switching of an inductive load than is possible where avalanching is initiated adjacent a recessed insulated gate structure.

As described in U.S. Pat. No. 5,072,266, the more highly doped subsidiary region of the second region is formed by introducing impurities through a first mask and subsequent second and third masks are used to introduce the impurities to form the conduction channel defining region of the second region and the third region and to form the trench. It is of course necessary to allow for misalignment tolerances between these three separate masks which inevitably places a restriction on the minimum device dimensions or design rules and, moreover, misalignments which may occur may make some of the device cells less rugged, that is more susceptible to breakdown by parasitic bipolar action, than the other device cells. Also alignment problems may affect the reproducibility of device characteristics between different processing batches.

Moreover, the formation of the central highly doped subsidiary region of the second region requires high doping concentrations and long diffusion or drive-in times and it may prove difficult to control the precise depth and curvature of the central more highly doped subsidiary region which will affect the precise voltage at which breakdown will occur and thus also exacerbate reproducibility problems. Furthermore because these portions are highly doped and deep, there may be more possibility of encroachment on the conduction channel regions which would adversely affect the device threshold voltage. In addition, the extension of the central highly doped subsidiary region into the generally lowly doped drain drift region may make the device more susceptible to punchthrough, thus making the breakdown voltage more sensitive to the precise thickness and doping of the first region which is generally an epitaxial layer. Again the characteristics of the first region may vary from batch to batch.

SUMMARY OF THE INVENTION

According to the present invention there is provided a semiconductor device comprising a vertical insulated gate field effect device and having a semiconductor body with a first semiconductor region of one conductivity type adjacent one major surface, a second semiconductor region of the opposite conductivity type formed within the first region adjacent the one major surface, a third region forming with the second region a rectifying junction meeting the one major surface, a recess extending into the first region from the one major surface so that the second and third regions abut the recess, an insulated gate formed within the recess for controlling conduction between the first and third regions along a conduction channel area defined by a relatively lowly doped first portion of the second region of the opposite conductivity type adjacent the recess and a fourth region of the one conductivity type forming with a relatively highly doped second portion of the second region remote from the recess a further rectifying junction which is reverse-biassed in at least one mode of operation of the device and has a predetermined breakdown voltage for causing the device to breakdown in the vicinity of the further rectifying junction away from the recess when a critical voltage is exceeded.

Thus, in a device in accordance with the invention the fourth region provides with the portion of the second region a rectifying junction which causes the device to break down in the vicinity of that rectifying junction away from the recess when a critical voltage is exceeded. Accordingly, the possibility of avalanche breakdown occuring adjacent the trench is avoided or at least reduced. In contrast to the structure described in U.S. Pat. No. 5,072,266, the breakdown structure provided by the fourth and second regions need not extend deep into the semiconductor body. Indeed, the fourth region may be a very shallow region and so may have very precisely controlled characteristics, for example doping and depth in the case where the fourth region is a semiconductor region. In addition, the breakdown structure provided by the present invention should not increase the possibility of punchthrough.

The second portion of the second region may meet the one major surface and be electrically shorted to the third region by a main electrode of the device provided on the one major surface thereby acting also to inhibit parasitic bipolar transistor action. The third region may be a region of the one conductivity type or could be a rectifying (e.g. Schottky) contact to the second region as discussed in for example U.S. Pat. No. 4,983,535. The fourth region is preferably a semiconductor region of the one conductivity type which is more highly doped than the first region and forms a pn junction with the second portion of the second region. The insulated gate may comprise an insulating layer covering the surface of the recess and a plug of conductive material provided within the recess on the insulating layer.

The insulated gate field effect device may be a power semiconductor device comprising an array of parallel-connected device cells each comprising a second semiconductor region of the opposite conductivity type formed within the first region adjacent the one major surface, a third region forming with the second region a rectifying junction meeting the one major surface and a recess extending into the first region from the one major surface so that the second and third regions abut the recess, the recesses of the device cells being connected together to define a continuous trench and the insulated gates defining a continuous insulated gate structure for controlling conduction along the conduction channel regions of the second regions, each second region having, remote from the trench, a relatively highly doped second portion of each second region of the opposite conductivity type forming with a respective fourth region of the one conductivity type a further rectifying junction which is reverse-biassed in at least one mode of operation of the device and has a predetermined breakdown voltage for causing the device to break down down in the vicinity of the further rectifying junction away from the recess when a critical voltage is exceeded.

In one example, each fourth region comprises a semiconductor region of the one conductivity type bounded by the relatively lowly doped portion of the second region and the relatively highly doped portion of the second region meets the one major surface and is bounded by the third region.

Generally, the second portion of the or each second region separates the or the associated fourth region from the one major surface.

The present invention also provides a method of manufacturing a semiconductor device comprising a vertical insulated gate field effect device, which method comprises providing a semiconductor body having a first region of one conductivity type adjacent one major surface, providing a first mask on the one major surface to define a first mask aperture forming a regular mesh, introducing impurities through the first mask to form a relatively lowly doped first area of the opposite conductivity type which will subsequently provide a number of relatively lowly doped first portions of second regions of the opposite conductivity type, introducing further impurities through the first mask aperture to form a second area of the one conductivity type which will subsequently provide a number of third regions of the one conductivity type, providing a second mask on the one major surface having a mask window defining a regular mesh over the second area, etching the semiconductor body through the second mask to define a mesh-like trench extending through the first and second areas into the first region thereby splitting the first and second areas into the first portions of the second regions and the third regions, respectively, providing an insulating layer on the trench surface and a conductive layer on the insulating layer to provide an insulated gate structure for controlling conduction between the first and third regions along a conduction channel area provided adjacent the trench by the relatively lowly doped portion of the second region, introducing impurities of the one conductivity type into the one major surface with a concentration insufficient to overdope the first portions of the second regions to provide fourth regions of the one conductivity type having a dopant concentration less than that of the third regions and greater than that of the first region and introducing impurities of the opposite conductivity type with a concentration insufficient to overdope the third regions to provide relatively highly doped second portions of the second regions with each second portion forming with the associated fourth region a pn junction which is reverse-biassed in at least one mode operation of the device and has a predetermined break down voltage for causing the device to breakdown in the vicinity of the pn junction away from the trench when a critical voltage is exceeded.

Such a method is relatively simple and moreover allows the first portions and third regions to be formed in a self-aligned manner. In addition because no mask is required to form the second portions of the second regions and fourth regions because these do not overdope the third regions and first portions of the second regions, respectively, these are also automatically aligned and the breakdown structure is thus provided without the need for any further masks. This means that the number of potential misalignment tolerances which must be taken into account is reduced and should enable a reduction in device dimensions allowing a reduction in on-resistance or a decrease in chip size.

BRIEF DESCRIPTION OF THE DRAWING

Embodiments of the invention will now be described, by way of example, with reference to the accompanying drawing, in which.

It should of course be understood that the Figures are not to scale and that various dimensions, especially the thicknesses of layers or regions may have been exaggerated in the interests of clarity. Similar reference numerals are used throughout the drawings to refer to similar parts.

DESCRIPTION OF THE PREFERRED EMBODIMENTS

Figure 1:
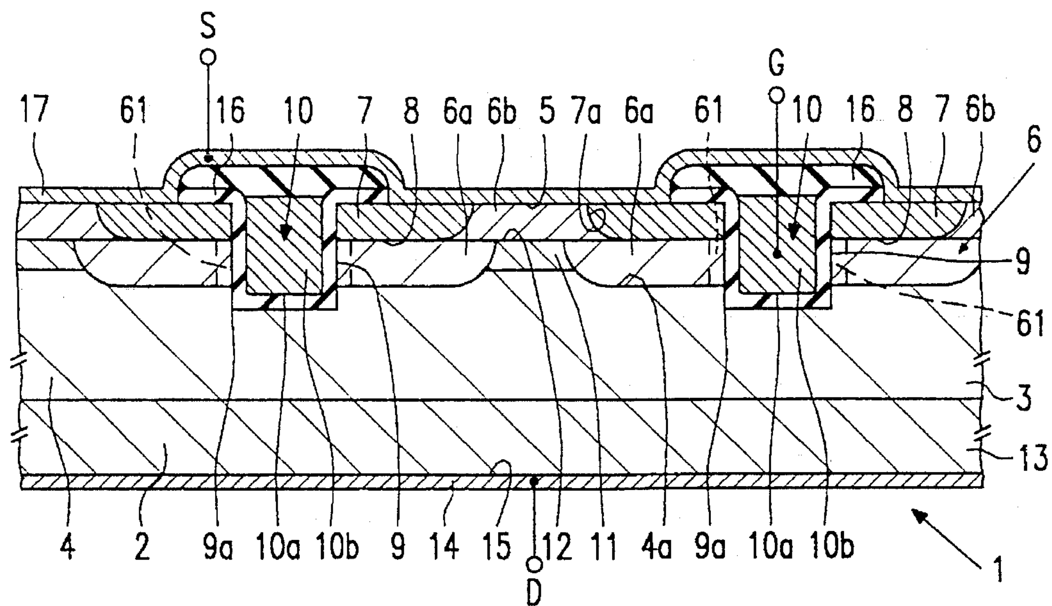
FIG. 1 is a cross-sectional view through part of a semiconductor device in accordance with the invention.

Referring now to the drawings, there is illustrated a semiconductor device 1 comprising a vertical insulated gate field effect device 2 and having a semiconductor body 3 with a first semiconductor region 4 of one conductivity type adjacent one major surface 5, a second semiconductor region 6 of the opposite conductivity type formed within the first region 4 adjacent the one major surface 5, a third region 7 forming with the second region 6 a rectifying junction 8 meeting the one major surface 5, a recess 9 extending into the first region 4 from the one major surface 5 so that the second and third regions 6 and 7 abut the recess 9, an insulated gate 10 formed within the recess 9 for controlling conduction between the first and third regions 4 and 7 along a conduction channel area 61 of the second region 6 adjacent the recess 9 and a fourth region 11 of the one conductivity type forming with a portion **6*b* of the second region 6 of the opposite conductivity type remote from the recess 9 a further rectifying junction 12 which is reverse-biassed in at least one mode of operation of the device and has a predetermined break down voltage for causing the device to break down in the vicinity of the further rectifying junction 12 away from the recess 9** when a critical voltage is exceeded.

Thus, in a device in accordance with the invention the fourth region 11 of the one conductivity type provides with the portion **6*b* of the opposite conductivity type of the second region 6 a further rectifying junction 12 which causes the device to break down in the vicinity of that further rectifying junction 12 away from the recess 9 when a critical voltage $V_c$ is exceeded. Accordingly, the possibility of avalanche occuring adjacent the recess 9 because of high electric fields at the recess 9 when the critical voltage is exceeded can be avoided or at least reduced. The fourth region 11 may be a very shallow region and so may have very precisely controlled characteristics, for example doping and depth in the case where the fourth region 11** is a semiconductor region. In addition, the breakdown structure provided by the present invention should not affect the punchthrough characteristics of the device.

Figure 2:
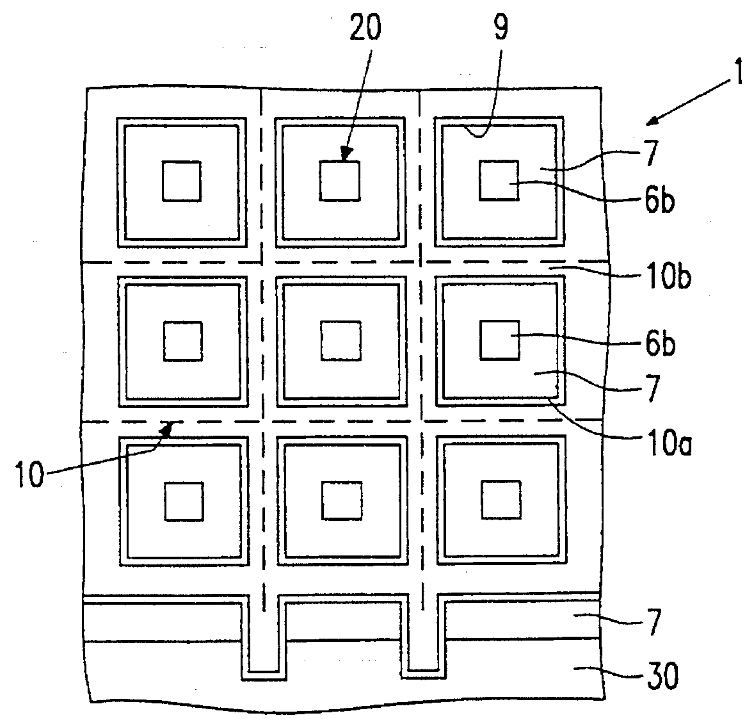
FIG. 2 is a top plan view, with top metallization omitted, of part of a semiconductor device in accordance with the invention.

Referring now specifically to the drawings. FIGS. 1 and 2 illustrate respectively a cross-sectional view through part of a semiconductor device 1 embodying the invention and a top plan view of part of the device with the top metallization removed.

In this example, the semiconductor device 1 comprises a vertical power insulated gate field effect transistor 2 which consists of many, generally many hundreds of parallel-connected insulated gate field effect device cells 20 (one complete cell is shown in FIG. 1 and more are shown in FIG. 2) showing a common drain region which in this case is provided by a relatively highly doped substrate 13 of the one conductivity type (n conductivity type is this case) on which the first region 4 is provided as a lowly doped epitaxial layer to form a drain drift region. A drain electrode 14 is provided on the free surface 15 of the substrate 13.

The dopant concentration and thickness of the first region will depend upon the desired voltage rating of the device but the first region may be, for example 6–7 μm (micrometers) thick and have a resistivity of 1 ohm-cm.

The device cells 20 are defined by the recesses 9 which, as can be seen from FIG. 2, are formed as a single continuous trench which defines a regular matrix mesh. In the example shown in FIG. 2, the mesh is a square mesh. However other regular shaped meshes or grids, for example hexagonal or rectangular or even separate rows of device cells may be used.

The insulated gates 10 are similarly formed in the trench 9 as a continuous insulated gate structure following the trench 9.

The insulated gate structure 10 comprises, in this example, a thin thermal gate oxide layer **10*a* provided on the walls of the trench and a gate conductive region in the form of an electrically conductive plug 10*b*, generally of doped polycrystalline silicon, provided within the trench 9 on the gate insulating layer 10*a***.

For consistency with planar device, that is DMOS, technology, and as seems logical from FIG. 2 each device cell 20 is herein defined as being bounded by the insulated gate structure 10 so that each cell has a notional boundary along a longitudinal center line of the trench as indicated by the dashed lines in FIG. 2.

Each cell 20 consists of a second region 6 which has a first portion **6*a* which is relatively lowly doped and forms a pn junction 4*a* with the first region 4. The first portions 6*a* are formed using planar technology as will be discussed in detail below so that the boundaries of the first portions 6*a* are defined where the first portions 6*a* abut the trench 9 to provide the conduction channel region 61 adjacent the insulated gate structure 10 and by the mask used during the introduction of the impurities. In the absence of any overlying regions, the pn junction 4*a* would meet the one major surface 5 in the center of each cell. The second portions 6*b* of the second regions 6 forming the rectifying junctions with the fourth region 11 are provided so as to be relatively highly doped and so as to extend beyond the inner periphery of the first portions 6*a* remote from the trench 9. In the example illustrated in FIG. 1, the relatively highly doped second portion 6*b* of each cell 20 extends to the one major surface across the center of the device cell 20**.

The third or source regions 7 of the device cells are, like the relatively lowly doped first portions **6*a*, formed using planar technology so that each source region 7 is bounded at its outer periphery by the trench 9 and at its inner periphery forms a pn junction 7*a* with the relatively highly doped second portions 6*b* of the second region 6. In this example, the fourth region 11 comprises a semiconductor region of the one conductivity type which is slightly more highly doped than the drain drift region 4 but not as highly doped as the source regions 7. Typically, the fourth region 11 is 2 to 10 times more highly doped than the drain drift region 4 which is bounded by the inner periphery of the relatively lowly doped first portion 6*a* beneath the relatively highly doped second portion 6*b* so as to form a further rectifying junction 12 with the second portion 6*b***.

The one major surface 5 of the semiconductor body 3 is covered by insulating material 16 in which contact windows are opened to enable metallization to make contact to the source regions 7 and the insulated gate structure. Only the source metallization 17, forming a main electrode of the device, is shown in FIG. 1. As can be seen from FIG. 1, the source metallization 17 connects the source regions 7 in parallel and, in addition, shorts each source region 7 to the second portion **6*b* of the associated second region 6** so as to inhibit parasitic bipolar action.

It will be appreciated by those skilled in the art that the periphery of the insulated gate field effect device will, especially where the device is a power device, have a field relief edge termination system. The edge termination system may be similar to that described in U.S. Pat. No. 5,072,266 and may, for example and as shown in FIG. 2, comprise a relatively deep p conductivity type guard ring 30 which envelopes the outermost corners of the grid-like trench 9 containing the insulated gate structure 10. The guard ring 30 may be formed prior to the active device structure. The guard ring 30 may have a field relief electrode extending from the guard ring 30 out onto field oxide (not shown) surrounding the insulated gate field effect device. For higher breakdown voltage devices, say 800 or 1000 or more volt devices, the edge termination system may include one or more field relief semiconductor rings as described in, for example, U.S. Pat. No. 4,573,066 (PHB 32934), U.S. Pat. No. 4,774,560 (PHB 32950) or U.S. Pat. No. 4,707,719 (PHB 33126).

A method suitable for manufacturing the device shown in FIGS. 1 and 2 will now be briefly described with reference to FIGS. 3 to 8.

Figure 3:
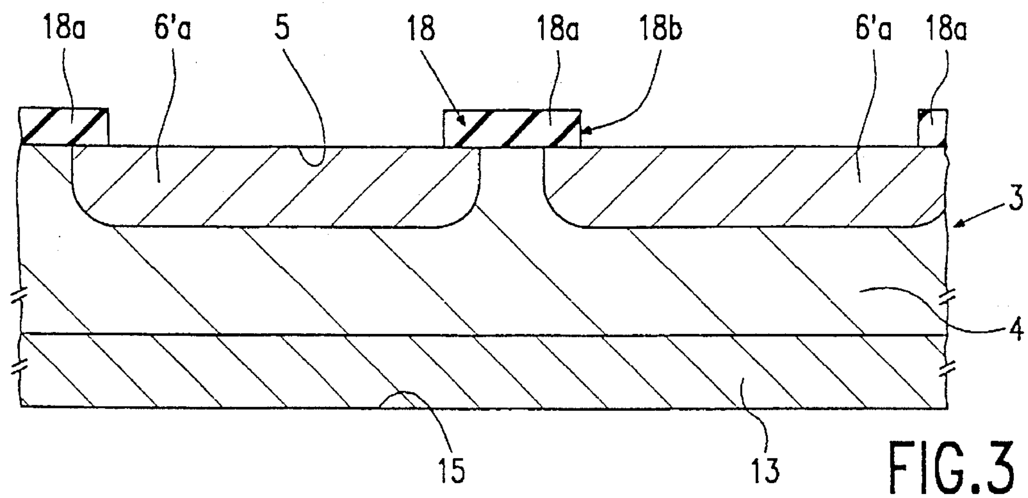
FIGS. 3 to 8 illustrate, in sequence, steps in a method of manufacturing the semiconductor device shown in FIG. 1.

A mask 18 is defined on the one major surface using conventional photolithographic processes to provide mask regions 18*a* bounding a grid or mesh pattern window 18*b*. In this example the mask 18 is a hard mask, that is a deposited insulating layer such as a layer of silicon oxide. Opposite conductivity type impurities, p conductivity type impurities in this case and usually boron ions with, typically, an energy in the range of 45–100 keV (kiloelectron volts), for example 70 keV, and a dose of $2–3\times10^{13}$ ions $cm^{-2}$, are introduced, generally implanted and then driven by heating the semiconductor body, to define a continuous p conductivity type first area 6'*a* of the desired depth having openings beneath the mask regions 18 as illustrated in FIG. 3.

Figure 4:
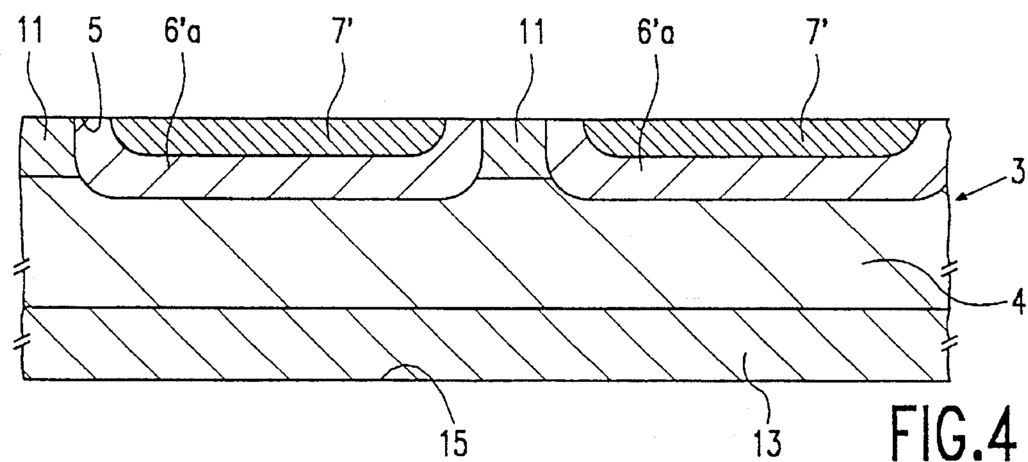

Impurities of the one conductivity type, n conductivity type in this example, are then introduced, generally implanted as arsenic ions with, typically, a dose of $5\times10^{15}$ $cm^{-2}$ and an energy of about range of e.g. 80 keV (kiloelectric volts) or possibly as phosphorus ions, through the same mask 18 to form a continuous n conductivity second area 7' (which will later provide the source regions 7) within and aligned to the p conductivity type first area 6'*a*. Impurities, again of the one conductivity type, are then introduced, generally implanted as arsenic ions, to form the fourth regions 11. The dose and energy of the respective implants are selected such that the fourth regions 11 is more lowly doped than the n conductivity type second area 7' but more highly doped than the first regions 4 and, as shown in FIG. 4, does not overdope the p conductivity type 6'*a*. The impurities for forming the n conductivity type second area 7' and for forming the fourth regions 11 may be driven (caused to diffuse) into the first region 4 together using conventional techniques of the impurities for forming the fourth regions 11 may be implanted after drive in of the impurities to form the n conductivity type second area 7' and then subjected to a very short rapid thermal anneal which causes little or no movement of the already diffused impurities. The latter arrangement may allow greater control over the depth of the fourth regions 11. In the latter case the impurities for forming the fourth regions could be implanted after definition of the insulated gate structure.

As another possible alternative, the fourth regions may be formed by implanting n conductivity type-impurities (typically using phosphorus ions with a dose of $2\times10^{12}$ ions $cm^{-2}$ and an energy of 120 keV) into the one major surface 5 prior to defining the mask 18 so that a continuous layer is formed which is later divided into the fourth regions 11 by overdoping caused by the introduction of the impurities to form the p conductivity type first area 6'*a*. In this case, the impurities would be driven in during the subsequent processing steps. This arrangement would however not allow such good control over the depth and doping profile of the fourth regions 11.

Figure 5:
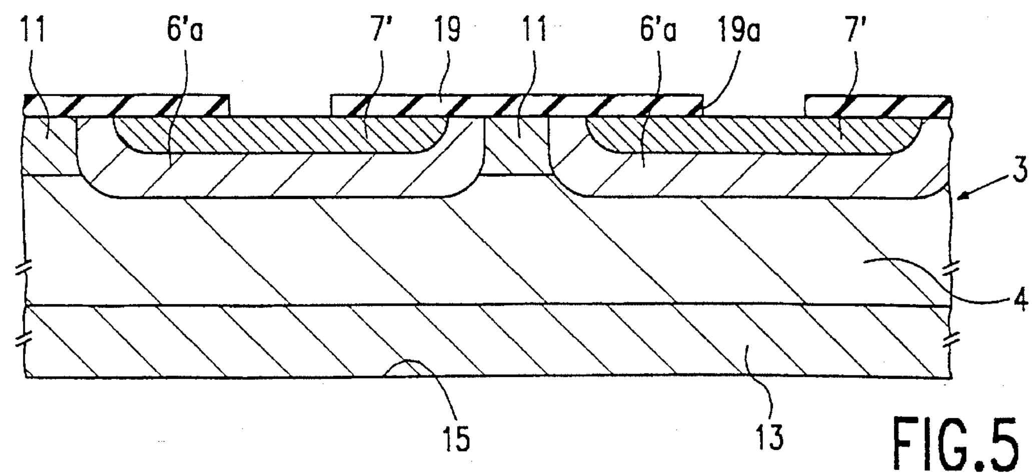

A further mask 19, again generally a hard, mask, is then formed so as to define a grid or mesh pattern window 19*a* located centrally of the previous mask regions 18 as shown in FIG. 5. The trench 9 is then etched (generally using an anisotropic etching process, such as a plasma or RIF (Reactive Ion Etch) process, possibly followed by a short isotropic etch to round off the corners 9*a* of the trench.

As will be appreciated by those skilled in the art, the etching of the trench defines the separate conduction channel area defining regions 6*a* and the separate source regions 7.

Figure 6:
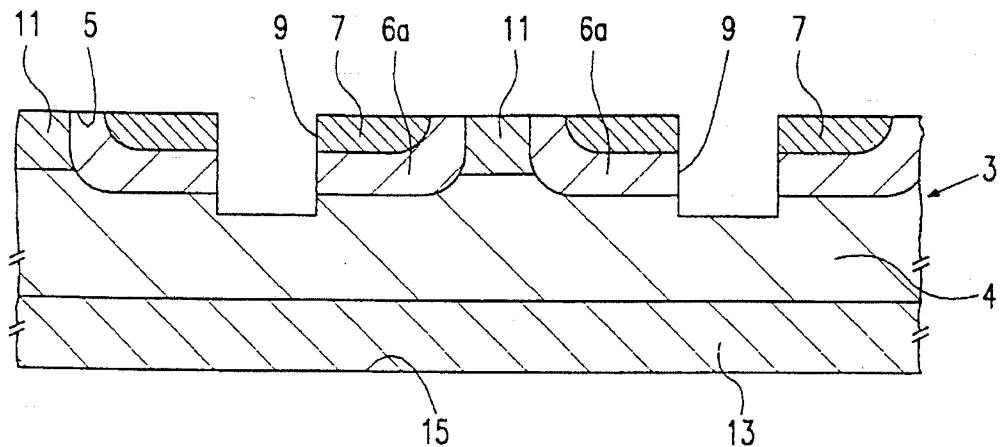

A thin thermal oxide layer 23 is then grown on the one major surface 5 and within the trench 9 as shown in FIG. 6. This thermal oxide layer 23 is used as the gate insulating layer.

Figure 7:
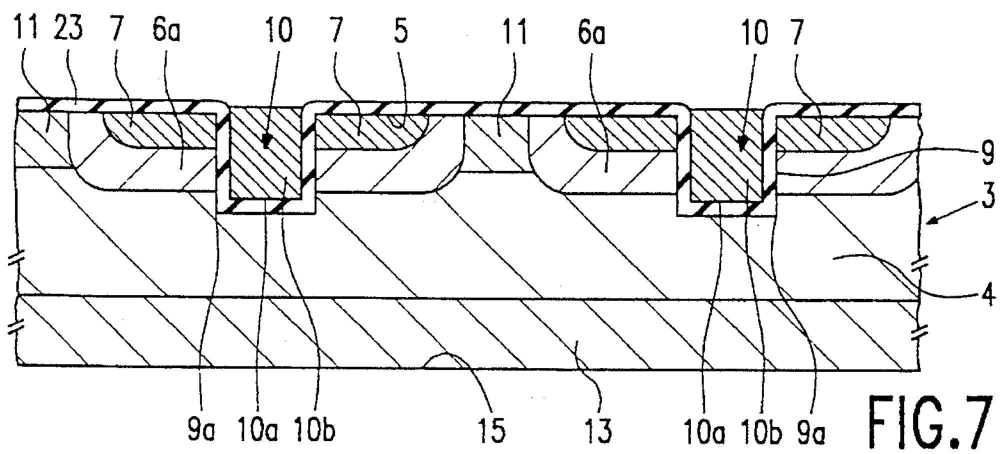
Figure 8:
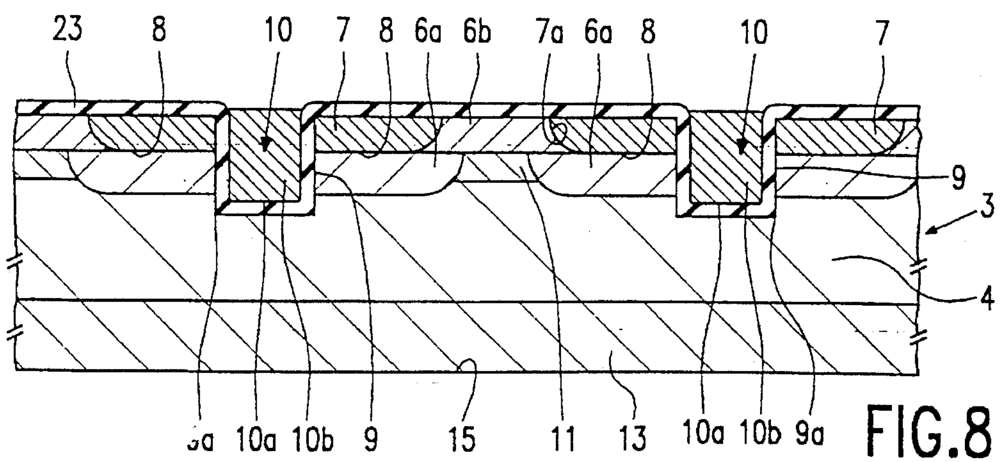

A layer of conductive material, in this example n conductivity type doped polycrystalline silicon, is then deposited and etched back to expose the top surface of the insulating layer 23 thereby leaving conductive material in the trench 9 to form the gate conductive region 10*b*. Impurities are then introduced, generally implanted and then driven in, to form the relatively highly doped second portions 6*b* of the second regions 6 as shown in FIG. 7. Generally these impurities are boron ions with an energy, typically, of 60 keV and a dose of about $1\times10^{15}$ ions $cm^{-2}$. This implantation step may be carried out without a mask as the dose is not sufficient to overdope the source regions 7, although the drive in may be selected to cause the portion 6*b* to overdope an upper part of the fourth region 11, depending upon the desired depth of the further rectifying junction 12. If considered desirable the insulated gate structure 10 could be masked during this implantation step.

An insulating layer, for example silicon oxide, is then deposited and patterned using conventional techniques to define the insulating regions 16. Metallization is then provided on the one major surface and patterned to define the source metallization 17 shorting the source regions 7 to the second portions 6*b* and the insulated gate metallization (not shown but indicated schematically by the gate electrode line G). The drain metallization 14 is provided on the other major surface 15 as illustrated in FIG. 1.

In operation of the device illustrated in FIGS. 1 and 2 and described above, when appropriate voltages are applied to the source and drain metallisations 17 and 14 and an appropriate gate voltage is applied to the gate G to induce a conduction channel in the conduction channel region 61, current flows between the source and drain electrodes S and D. In the event of a voltage above a critical voltage being applied to the drain electrode, such as may occur when switching an inductive load, and avalanche breakdown will occur in the vicinity of the further rectifying junction 12 in the bulk of the semiconductor away from the trench 9 rather than adjacent the trench corners 9*a*, thus protecting the device from the potential side effects of breakdown adjacent the trench corners, that is from either device destruction due to bipolar breakdown or performance degradation because of hot carrier injection into the gate insulating layer 10*a*.

The actual voltage at which avalanche breakdown will occur at the further rectifying junction 12 will depend on the relative dopant concentrations of the various regions and in particular on the dopant concentrations of the second portions 6*b* and the fourth regions 11. These may be selected as desired by the person skilled in the art to achieve a breakdown voltage commensurate with the voltage rating desired for the device. The further rectifying junction 12 could also be curved rather than planar so as to increase the electric field at that junction under reverse-bias, thus providing another way of adjusting the breakdown voltage of the further rectifying junction 12.

It will of course be appreciated that the conductivity types given above may be reversed and that the device may be formed using materials or combinations of materials other than silicon.

Although the source regions 7 have been shown above as semiconductor regions they could be conductive regions forming Schottky contacts to the second regions as described in U.S. Pat. No. 4,983,535.

The insulated gate field effect device described above may be a discrete device or could be integrated with other active device elements, for example logic devices where the insulated gate field effect device is a power device to produce a so-called intelligent power switch or smart discrete device.

From reading the present disclosure, other modifications and variations will be apparent to persons skilled in the art. Such modifications and variations may involve other features which are already known in the semiconductor art and which may be used instead of or in addition to features already described herein.

We claim:

1. A method of manufacturing a semiconductor device comprising a vertical insulated gate field effect device, which method comprises providing a semiconductor body having a first region of one conductivity type adjacent one major surface, providing a first mask on the one major surface to define a first mask aperture forming a regular mesh, introducing impurities through the first mask to form a relatively lowly doped first area of the opposite conductivity type which will subsequently provide a number of relatively lowly doped first portions of second regions of the opposite conductivity type, introducing further impurities through the first mask aperture to form a second area of the one conductivity type which will subsequently provide a number of third regions of the one conductivity type, providing a second mask on the one major surface having a mask window defining a regular mesh over the second area, etching the semiconductor body through the second mask to define a mesh-like trench extending through the first and second areas into the first region thereby splitting the first and second areas into the first portions of the second regions and the third regions, respectively, providing an insulating layer on the trench surface and a conductive layer on the insulating layer to provide an insulated gate structure for controlling conduction between the first and third regions along a conduction channel area provided adjacent the trench by the relatively lowly doped portion of the second region, introducing impurities of the one conductivity type into the one major surface with a concentration insufficient to overdope the first portions of the second regions to provide fourth regions of the one conductivity type having a dopant concentration less than that of the third regions and greater than that of the first region and introducing impurities of the opposite conductivity type with a concentration insufficient to overdope the third regions to provide relatively highly doped second portions of the second regions with each second portion forming with the associated fourth region a pn junction which is reverse-biassed in at least one mode operation of the device and has a predetermined breakdown voltage for causing the device to breakdown in the vicinity of the pn junction away from the trench when a critical voltage is exceeded.

* * * * *